United States Patent [19]

Stora et al.

[11] Patent Number: 5,680,294

[45] Date of Patent: Oct. 21, 1997

[54] PLUGGABLE POWER SUPPLY FOR CARD CAGE

[75] Inventors: Michael J. Stora, Boonton; Kevin P. Faith, Lake Hiawatha, both of N.J.; Thomas M. Dlugolecki, Mechanicsburg; Jeffrey M. Norton, Lebanon, both of Pa.

[73] Assignee: The Whitaker Corporation, Wilmington, Del.

[21] Appl. No.: 411,500

[22] Filed: Mar. 28, 1995

[51] Int. Cl.$^6$ ........................................... H05K 7/20
[52] U.S. Cl. ................... 361/695; 361/796; 361/798
[58] Field of Search ................... 307/150; 361/687–697, 361/715–716, 724–730, 732–733, 785, 788, 796–797, 803

[56] References Cited

U.S. PATENT DOCUMENTS

| | | | |
|---|---|---|---|
| 4,084,250 | 4/1978 | Albertine et al. | 364/708 |
| 4,217,624 | 8/1980 | Tuck | 361/730 |
| 4,471,898 | 9/1984 | Parker | 228/20 |
| 4,498,123 | 2/1985 | Fuss et al. | 361/725 |
| 4,756,473 | 7/1988 | Takemae et al. | 361/697 |
| 4,817,865 | 4/1989 | Wray | 361/695 |
| 4,845,589 | 7/1989 | Weidler et al. | 361/342 |
| 4,899,254 | 2/1990 | Ferchau et al. | 361/695 |
| 4,901,200 | 2/1990 | Mazura | 361/379 |
| 5,010,450 | 4/1991 | Werdin et al. | 361/415 |
| 5,034,853 | 7/1991 | Mazura et al. | 361/391 |
| 5,210,680 | 5/1993 | Schiebler | 361/695 |
| 5,214,572 | 5/1993 | Cosimano et al. | 361/796 |
| 5,297,004 | 3/1994 | Mazura | 361/690 |
| 5,398,161 | 3/1995 | Roy | 361/788 |
| 5,409,419 | 4/1995 | Euchner et al. | 454/184 |

FOREIGN PATENT DOCUMENTS

| | | | |
|---|---|---|---|
| 8900463 U | 4/1989 | Germany. | |
| 1191064 | 7/1993 | Japan | 361/733 |
| 3015595 | 8/1993 | WIPO | 361/687 |

OTHER PUBLICATIONS

*Control Resources Catalog*, "SmartFan Speed Controllers and Alarms", pp. 10, 16, 22; 1993; Control Resources, Inc. Harvard, MA.
*ebm Pabst Catalog*, "Fans and Blowers", pp. 15–19, 22–23, 56, 186–187; 1995; ebm Industries, Farmington, CT.
*VICOR Product Catalog*, pp. 8–11, 19, 28–29, 40–51, 61; 1991; Vicor Corporation, Andover, MA.
*Electronic Products*, "Pluggable Power Supplies Solve Many Design Problems", pp. 49–50; Mar. 1995.
*Schroff Brochure*, "Microcomputer Packaging Systems", four pages, Apr., 1993; Schroff, Inc., Warwick, RI.
European Search Report, EP Application No. 96301887.4 mailed Feb. 27, 1997 (three pages).

*Primary Examiner*—Gregory D. Thompson
*Attorney, Agent, or Firm*—Anton P. Ness

[57] ABSTRACT

A power supply module (100) for use with a card cage (10) for conditioning card cage input power and transmitting DC power to a backplane (20) of the card cage. The module (100) is adapted to be inserted into a card-receiving region (14) of the card cage from the front, and is removable therefrom. Connectors (70) on the leading edge (66) of the circuit card (102) of the module (100) self-engage with complementary connectors (30) of the backplane to establish power and signal connections therewith upon full insertion of the power supply module into a power module site (34) of the card-receiving region (14). The power supply module includes remote operator shut-off capability, overvoltage protection, overcurrent protection, overtemperature protection, temperature and voltage monitoring, and provides for orderly powering-up and powering-down of the card cage and for initializing critical data storage in the event of power failure. Either the power supply module (100) or card cage (10) provides rectification of AC power input to DC power. The module (100) is adapted to be air cooled by the cooling system for the card-receiving region, defined by a pluggable cooling module (50) with air flow metered into the card-receiving region (14) by a baffle plate (90).

21 Claims, 7 Drawing Sheets

PLUGGABLE POWER SUPPLY FOR CARD CAGE

FIELD OF THE INVENTION

The present invention relates to card cages for electrically interconnecting circuit cards to a common backplane within a framework, and more particularly to power supplies for providing direct current to the interconnected system.

BACKGROUND OF THE INVENTION

Card cage systems comprise arrays of daughter circuit cards that are electrically interconnected with a common backplane or mother board that is generally positioned in a framework at the inwardmost extent of a daughter card-receiving region. Guide channels on side walls of the framework surrounding the card-receiving region provide guidance for insertion of each daughter card, assuring that electrical connectors mounted on the leading edge of the daughter card are aligned with complementary connectors on the backplane to become mated upon full insertion of the daughter card. The arrays of electrical and electronic components on the daughter cards and the backplane require electrical power in the form of direct current, and since most electrical power to offices and other card cage sites is generally transmitted in alternating current, conversion to direct current is required.

Generally, the direct current is provided to the backplane from a subassembly to which is transmitted alternating current, and the subassembly is devoted to conversion to direct current. In a conventional approach, a DC-providing subassembly is removably mounted in the rear of the systems enclosure remote from the card-receiving region; the alternating power is received by the subassembly via a wire bundle while the electrical connections with the backplane are provided either by direct mechanical connection of subassembly connectors to backplane connectors, or by another wire bundle.

It is desired to provide a power supply that is front mountable into a card cage, and is easily removable therefrom.

It is further desired to provide a power supply that establishes its electrical connections with the backplane and with the AC power input merely by insertion into the card cage.

It is also desired for such power supply module to contain power monitoring circuits and also safety circuits as well as circuits for the protection of the electronic components in the card cage from transients.

SUMMARY OF THE INVENTION

The present invention provides a card cage system with a power supply for converting AC power input to DC power, that is configured as a daughter card and pluggable into the daughter card-receiving region, and is otherwise manipulatable as a unit analogous to a daughter card. At a power module site preferably at one end of the card-receiving region, the power supply module is insertable along guide channels along side walls of the region. Full insertion of the power supply module establishes all of its electrical connections with both the AC power input lines and DC power transmission to the backplane automatically, using power terminals within card edge connectors along the leading edge of the circuit card of the power supply module. A pair of manually actuated ejectors are utilized at ends of the trailing end of the module to cooperate with the card cage framework at the front of the card cage to eject the module when desired, analogous to ejection of daughter cards.

Preferably the power supply module includes integral diagnostic and control capability, such as: system temperature health monitoring, overtemperature protection, overvoltage protection, overcurrent protection, voltage monitoring to provide orderly power-up and power-down sequences, and initiating storage of critical data in the event of power shut off.

In another aspect of the present invention, a cooling module is insertable into (and removable from) the card cage adjacent the card-receiving region, providing for forced air circulation for dissipation of thermal energy from the daughter cards and from the power supply module. The cooling module may use a single fan unit, and sides of the power supply module as well as sides of the daughter cards, are open to receive air being circulated by the cooling module. A baffle plate is mounted between the cooling fan and the card-receiving region and is adapted to meter air volume flow to assure sufficient air to the power supply module from the fan while maintaining sufficient air flow to the daughter cards. The cooling module upon full insertion establishes all the necessary electrical connections with the backplane, with a drawer connector on a rearward location of the cooling module chassis that mates with a complementary connector at the rearward end of the cooling module-receiving region, in a self-aligning mating connector system using conventional drawer connectors. Fan speed is controlled by a closed-loop control circuit that monitors outlet air temperature and sets the fan voltage, and hence fan speed, accordingly.

It is an objective of the present invention to provide a power supply module configured and dimensioned to be manipulated as a unit and insertable into and removable from the front of a card-receiving region of a card cage.

It is also an objective for such power supply module to establish all of its electrical connections with input power lines and with the backplane automatically upon insertion into the card cage, through self-engaging connectors, thereby eliminating any need for cables interposed between the power supply and the backplane for carrying DC power from the module to the backplane and their tendency to degrade the dynamic and noise performance of the power delivery system.

It is a further an objective for such module to include integral diagnostic and control capability.

It is additionally an objective to provide a power supply module that is cooled by the card cage cooling system, eliminating the need for a separate power supply cooling arrangement.

In another aspect of the present invention, it is an objective to provide a self-contained front-insertable and removable air cooling module adapted to dissipate heat from all the card cage daughter cards and the power supply module simultaneously.

An embodiment of the present invention will now be disclosed by way of example with reference to the accompanying drawings.

DETAILED DESCRIPTION OF THE PREFERRED EMBODIMENT

Figure 1:
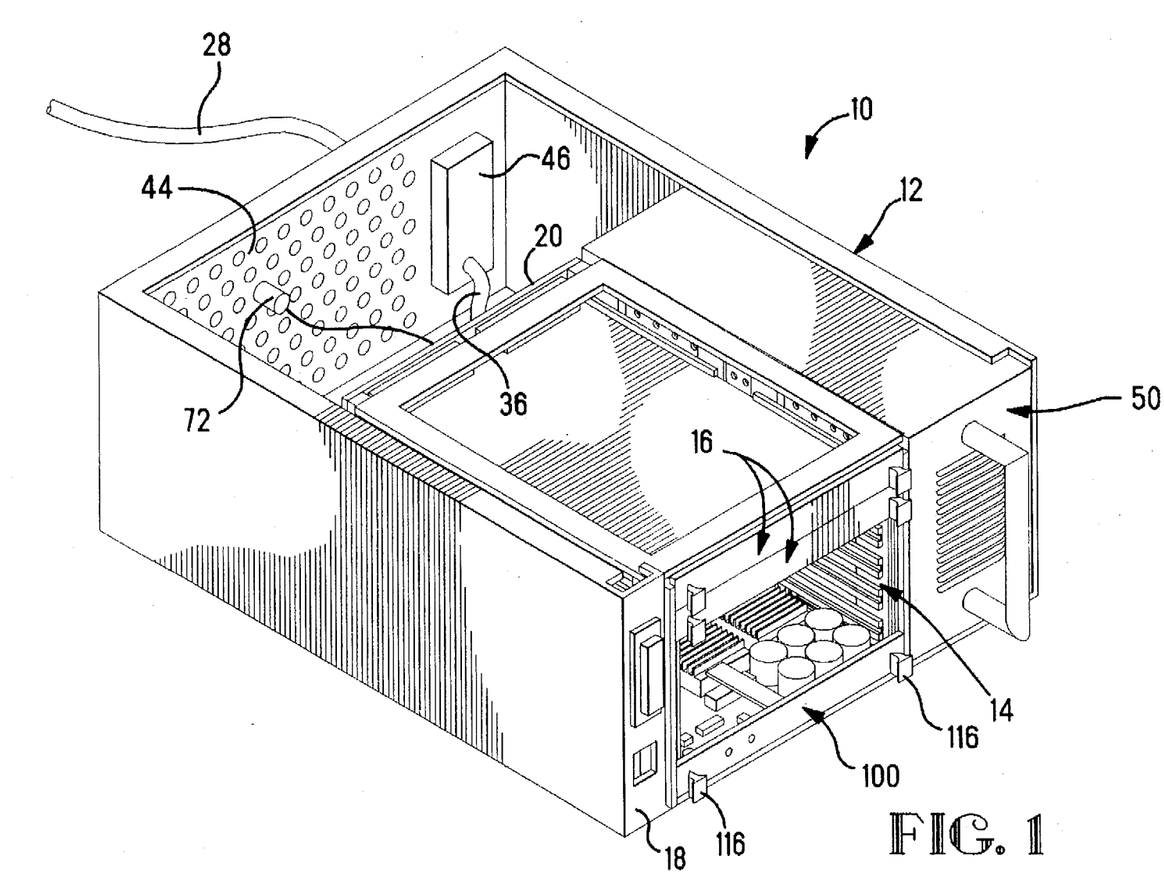
FIG. 1 is an isometric view of a card cage with top cover removed, illustrating several daughter cards in a card-receiving region thereof, and a power supply module of the present invention therein.
Figure 2:
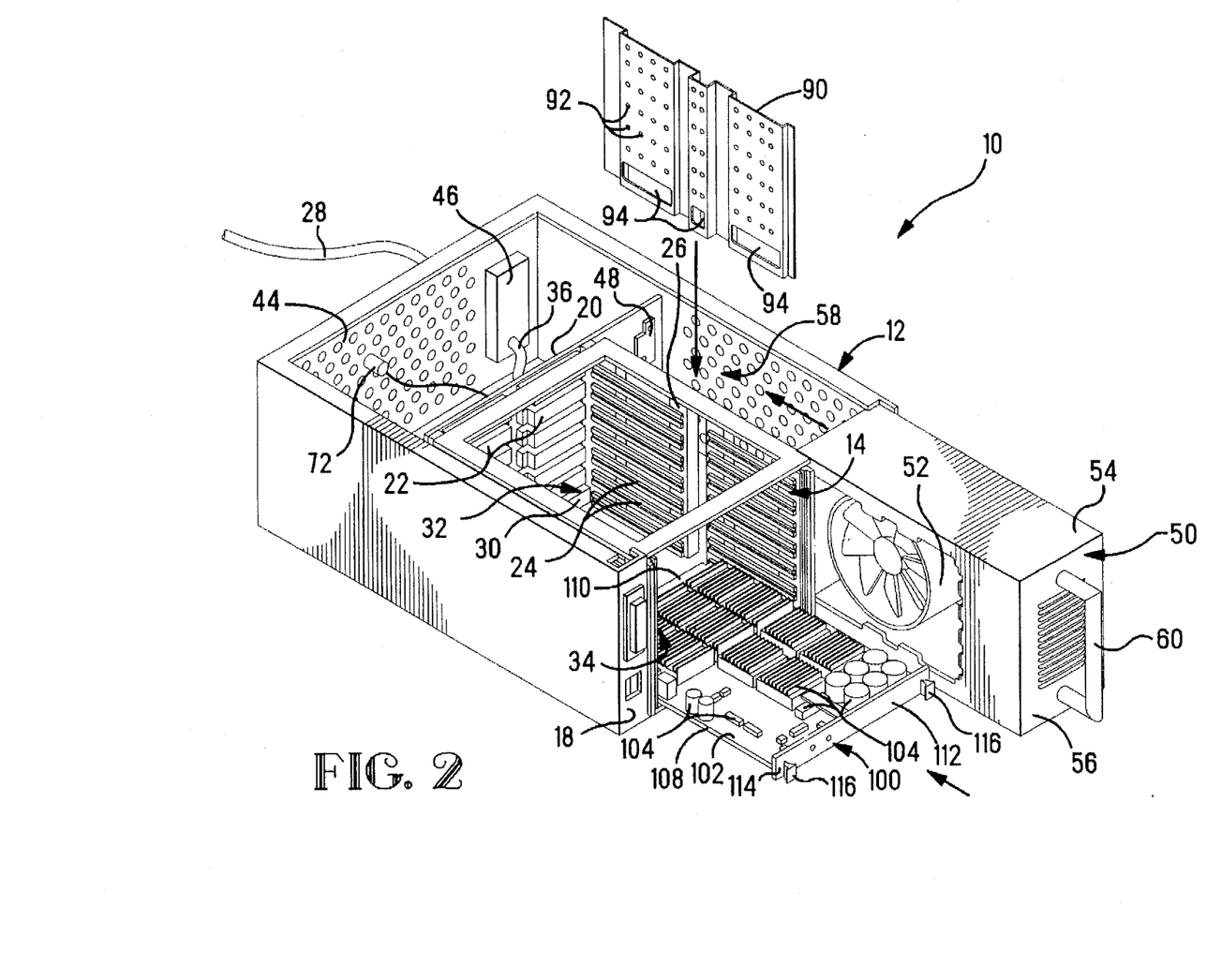
FIG. 2 is an isometric view of the card cage of FIG. 1 with the power supply module and the cooling fan module partially withdrawn, and a baffle plate to be mounted therebetween for metering the air flow.

In FIGS. 1 and 2 is shown a card cage system 10 having a framework 12 defining a card-receiving region 14 for holding an array of daughter circuit cards 16 upon insertion thereinto from a front face 18 of the framework. A backplane 20 traverses an inner end of card-receiving region 14 and has electrical connectors 22 associated with respective ones of daughter cards 16, mounted on backplane 20 adjoining card-receiving region 14. Backplane connectors 22 become mated with connectors mounted on leading edges of the daughter cards to establish electrical connections with daughter circuit cards 16, upon their full insertion into card-receiving region 14. Framework 12 provides pairs of guide channels 24 on interior sidewalls 26 for guided insertion of the daughter cards by way of the exposed side edge portions of the daughter cards, serving to align the edge-mounted connectors of the cards with backplane connectors 22 for electrical interconnection of their circuits with corresponding circuits of the backplane upon full insertion. Also seen in FIGS. 1 and 2 is a power supply module 100 of the present invention (with top cover removed) at power module site 34, a cooling fan module 50 at cooling module site 58, and an air flow-metering baffle plate 90 mounted to card cage framework therebetween.

A power cable 28 delivers electrical power in the form of alternating current, with the AC power passing at least into power port 46; cable 36 extends to one of the backplane power connectors 30 at a power interconnection site 32 associated with power module site 34 for power supply module 100. Power port 46 preferably includes a power switch, a power breaker, and an EMI filter, all as is conventional; optionally, power port 46 may include rectification capability for conversion of AC power to DC power.

Cooling fan module 50 contains a fan unit 52 mounted on a chassis 54 and provides forced air circulation for dissipation of heat generated by the electrical and electronic components of the daughter cards, the backplane and the power supply module. Apertured end wall 56 of the cooling fan module provides for air intake along with an apertured outer side wall of the card cage framework, and apertured baffle plate 90 cooperates with adjacent apertured interior sidewall frame 26 of framework 12 to permit metered air flow into card-receiving region 14 and over the various electrical and electronic components of the daughter cards 16. Outer walls of framework 12 are also apertured and serve as outlets, facilitating air flow. Cooling fan module 50, like power supply module 100, is configured for insertion into card cage framework 12 from front face 18 at cooling module site 58 by means of handle 60 and guide channels of the framework cooperating with side edges of the cooling module chassis in similar fashion to the daughter cards and guide channels 24.

Figure 3B:
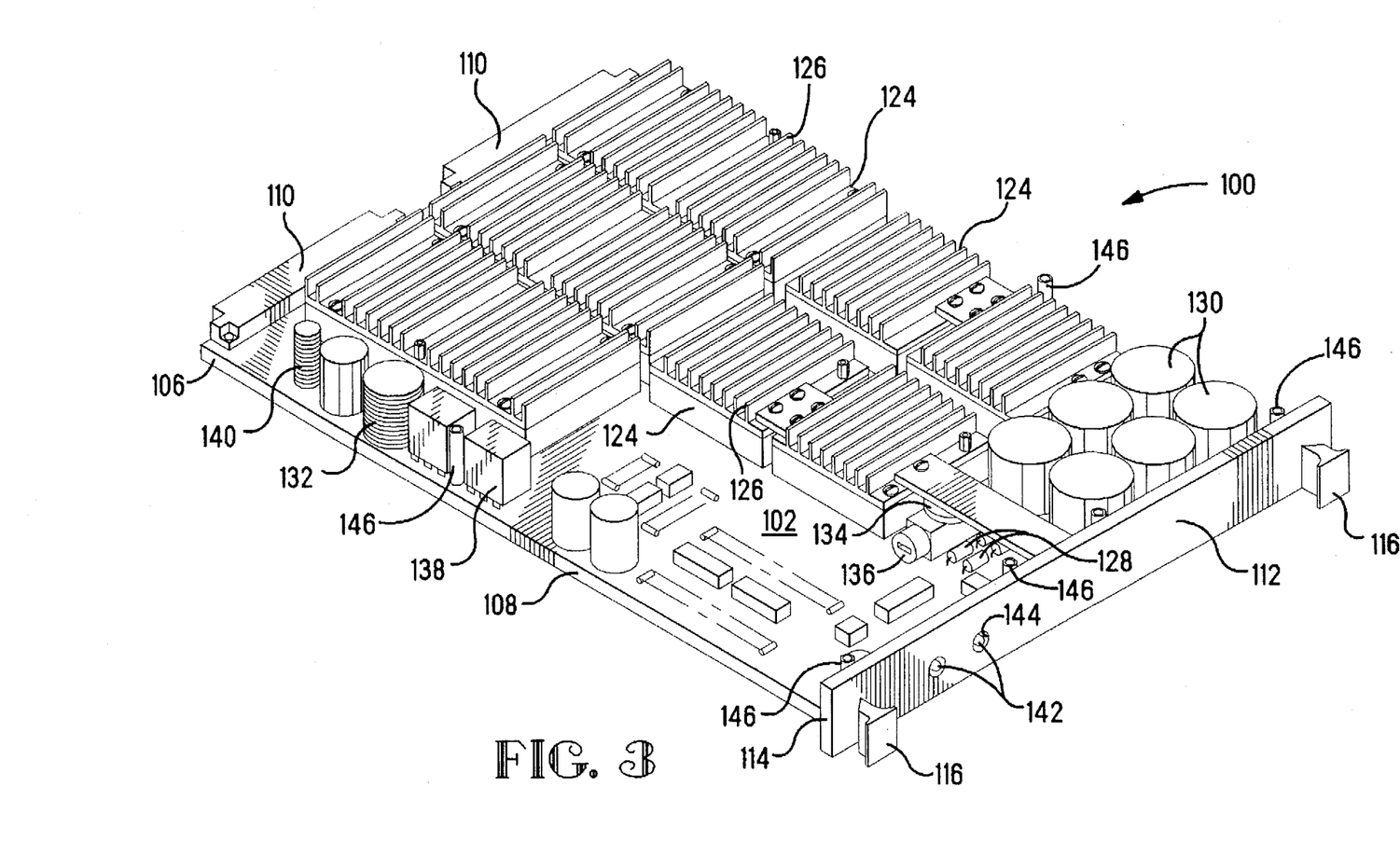
FIG. 3 is an isometric view of the power supply module of the present invention showing representative electrical and electronic components mounted on the circuit card thereof, and connectors mounted on the leading edge thereof.
Figure 4:
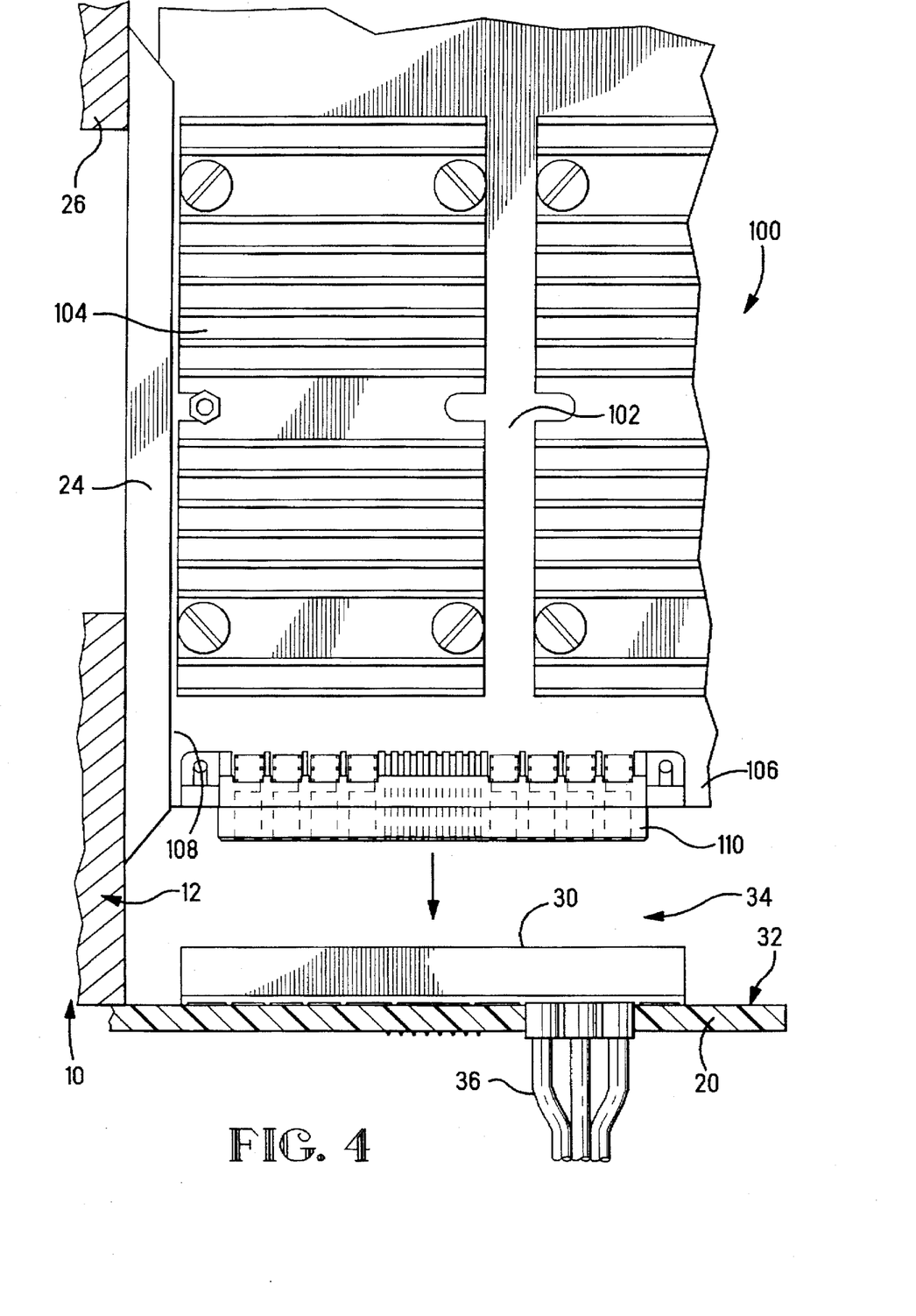
FIG. 4 is an enlarged partial plan view of a portion of the leading edge of the circuit card of the power supply module spaced from the backplane, illustrating the self-engaging connectors of both positioned to become mated.

Referring now to FIGS. 2 to 4, backplane 20 provides a power interconnection site 32 by power connectors 30 mounted thereto aligned with power module site 34. One of the power connectors provides feedthrough capability for terminals terminated to ends of power conductors 36 connected with AC power cable 28. Power connectors 30 are so positioned and aligned at power interconnection site 32 to become mated with corresponding power connectors 110 of the power supply module 100.

Power supply module 100 includes a circuit card 102 having an array of electrical and electronic components, generally identified as components 104, mounted thereon, and circuit card 102 includes a leading edge 106 and side edges 108 orthogonal thereto. Circuit card 102 is appropriately sized and shaped to be inserted into card-receiving region 14 with side edges 108 guided along guide channels 24 mounted on opposed interior sidewall frames 26 bounding card-receiving region 14. Module power connectors 110 are mounted on leading card edge 106 and have electrical terminals appropriately electrically connected by card circuitry to various ones of components 104. Components 104 may include components devoted to converting AC electrical input to DC electrical output, for transmission to backplane 20. Preferably top and bottom covers are secured to module 100 for electrical insulation and protection during handling.

Altogether, components 104 mounted on circuit card 102 are selected to define a sufficiently compact profile enabling insertion of the power supply module 100 into card-receiving region 14. Thus module 100 is adapted to be inserted into power module site 34 from front face 18 of card cage 10, and also removable therefrom, and power module connectors 110 automatically engage with backplane power connectors 30 upon full insertion of power supply module 100 into card-receiving region 14, and also automatically disengage upon removal of power supply module 100 from the card cage.

FIG. 4 illustrates one of the power module connectors 110 on leading card edge 106 aligned with and about to become mated with a corresponding backplane power connector 30, so that the electrical terminals therein become mated in associated pairs. The terminals within connectors 30,110 establish electrical interconnections for transmission of power input from conductors 36 of input cable 28 fed through backplane 20 to power supply module 100 and simultaneously establish electrical interconnections for transmission of power from power supply module 100 to backplane 20. Connectors 30,110 also preferably establish electrical interconnections for signal transmission between the power supply module and the backplane.

Figure 5:
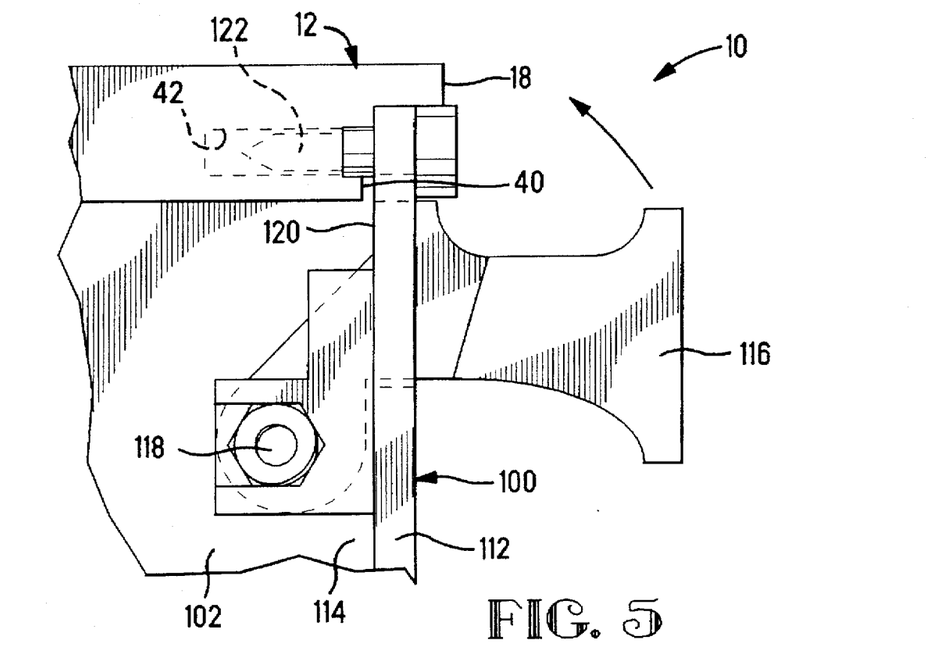
FIGS. 5 and 6 are enlarged plan views of an ejector mechanism of the power supply module fully inserted in FIG. 5, and actuated to eject the module in FIG. 6.
Figure 6:
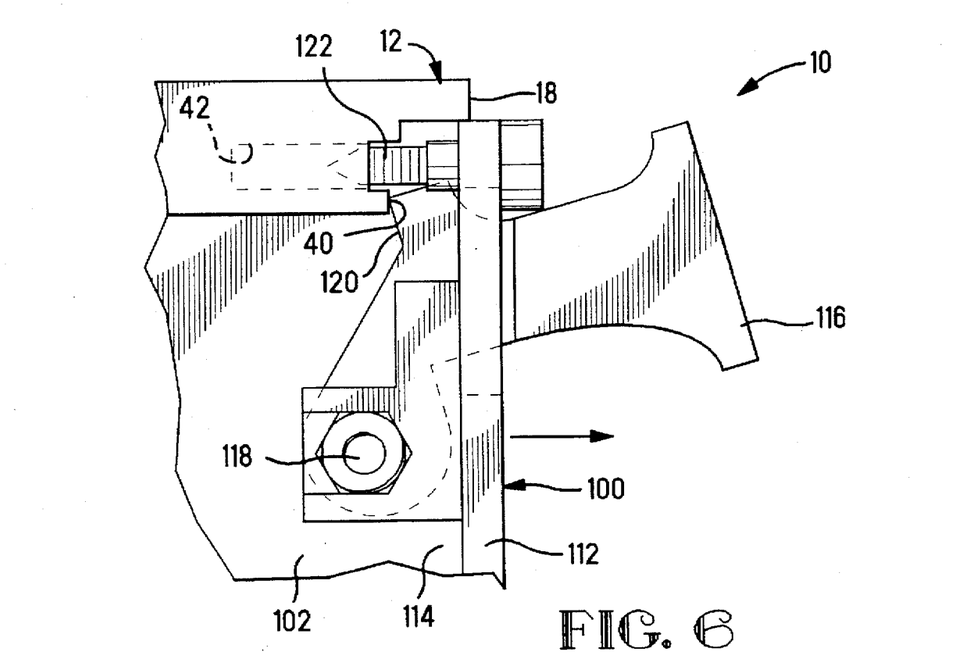

Power supply module 100 also includes a front panel 112 mounted onto trailing edge 114 of circuit card 102, with front panel 112 traversing that portion of front face 18 of the card-receiving region 14 defining power module site 34. With reference to FIGS. 3, 5 and 6, secured to front panel 112 at opposed ends thereof are a pair of ejectors 116, with ejectors 116 being pivotable about pivot pins 118 laterally outwardly upon manipulation thereof. Each ejector 116 includes an engagement section 120 cooperable upon pivotal actuation thereof with a forwardly facing portion 40 of framework 12 adjacent power module site 34, to urge power supply module 100 outwardly a limited distance sufficient to disengage the mated pairs of electrical terminals in backplane power connectors 30 and power module connectors 110 along backplane 20 at power interconnection site 32 (FIG. 4). Also seen in FIGS. 5 and 6 are fasteners 122 received into threaded apertures 42 into framework 12 along front face 18, for securing power supply module 100 in its fully inserted position within the card cage.

Figure 7:
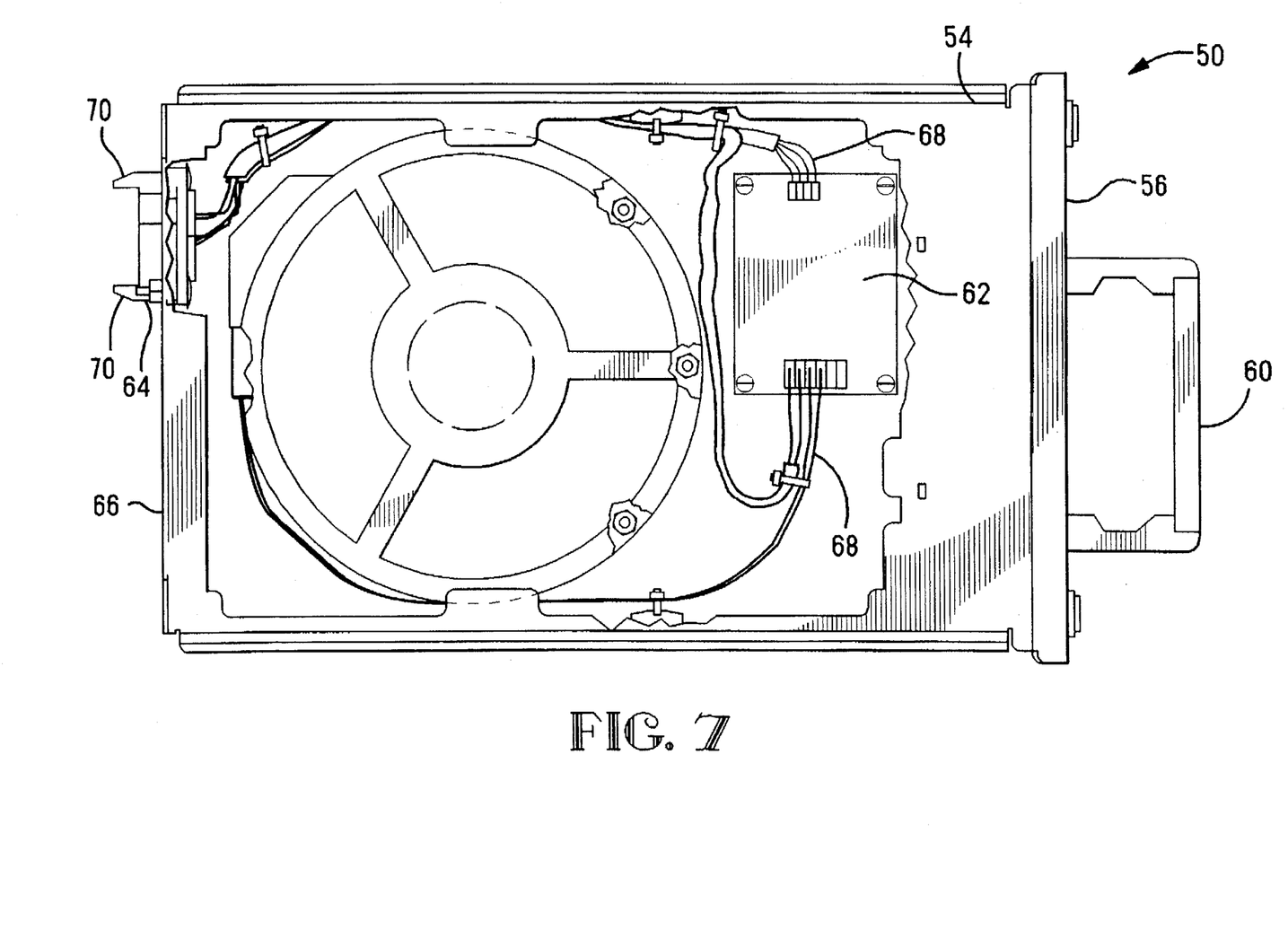
FIG. 7 is an elevation view of the cooling module showing the chassis with the fan unit removed, a control circuit for the fan unit, and a pluggable connector mounted on an inner end of the module.

In FIG. 7, more detail of cooling fan module 50 is shown. Fan unit 52 (FIG. 2) is mounted to the chassis 54 of the module centered with respect to the pattern of air flow holes through baffle plate 90 (FIG. 2) when cooling module 50 is fully inserted into the framework 12 of card cage 10. Also shown is a fan control circuit 62 for the fan unit, as well as an electrical connector 64 mounted onto the chassis panel 66 at the inner end of cooling module 50. Electrical connector 64 is of the drawer type adapted to mate with a complementary drawer connector 48 (FIG. 2) in a rack-and-panel arrangement. Wiring 68 connects the contacts of connector 64 with corresponding circuits of the control circuit 62.

The complementary drawer connector 48 (FIG. 2) may be mounted directly on backplane 20, or mounted on framework 12, and is at least electrically connected to circuits thereof, and will establish all power and control interconnections with connectors at a cooling fan module interface at the inner end of the module 50. The drawer connectors utilize integral alignment posts 70 of connector 64 received into alignment apertures of the other so that one of the connectors that is float-mounted, adjusts its position prior to mating of the electrical contacts to provide precise alignment of the contacts. One example of a conventional matable drawer connector assembly is AMP METRIMATE connectors sold by AMP Incorporated, Harrisburg, Pa. under Part Nos. 211759-1 and 211758-1 Plug and Receptacle Connectors.

Preferably, fan speed is controlled by a closed-loop control circuit 62 of the cooling module. A temperature sensor 72 within the card cage monitors the outlet air temperature, generating a signal fed back to the control circuit that sets the fan voltage, and subsequently the fan speed, accordingly. The benefit to this approach is that fan noise, which is proportional to fan speed, is greatly reduced under conditions that do not require maximum cooling (such as both low card cage power usage and low external ambient temperature).

Baffle plate 90 of FIG. 2 is mounted to the framework 12 alongside interior sidewall frame 26 along the outside of card-receiving region 14. Baffle plate 90 provides arrays of holes 92 associated with respective daughter card locations in card-receiving region 14 and positioned between guide channels 24, permitting air flow to the electrical and electronic components (not shown) of the daughter cards. Baffle plate 90 also provides large slots 94 adjacent power module site 34 of card-receiving region 14 having sizes selected to permit maximum air flow to the power supply module, where most of the thermal energy generated by operation of the card cage will occur. Thus baffle plate 90 is adapted to meter the flow of air from a single fan unit to cool both the daughter cards and the power supply module simultaneously. Holes in the back panel 44 of the card cage framework define the exhaust for forced air from the card cage. Preferably the temperature sensor 72 for outlet air temperature is mounted generally in the center of back panel 44.

A cooling module 50 may include, for example, a DC VARIOFAN fan unit having Part No. 10224NT sold by ebm Industries, Inc. of Farmington, Conn. This unit is said to be operational with 24 volts DC power input, in a range of from 12 to 28 volts DC and from 8.5 to 18 watts; such unit has a diameter of less than 7 inches and a width of 2 inches, weighing under two pounds. Preferably an air filter is selected to filter dust from intake air and also provide for shielding the adjacent environment from the escape or entry of electromagnetic interference from the card cage. In the control circuit, a speed controller may be for example a SMARTFAN Model OMNI S-DC single sensor-channel DC controller sold by Control Resources, Inc. of Harvard, Mass., having Part No. 024S290A. The control circuit may be used with a SMARTFAN Sensor temperature alarm having Part No. P1 for remote temperature probing, also sold by Control Resources, with the alarm utilizing an optically isolated phototransistor to signal the logic circuit of the controller. The controller for nominal 24 volt DC operation applies a smooth DC voltage to the fan for minimal noise, and varies the fan voltage to vary the air output according to heat dissipation needs of the card cage.

Figure 8:
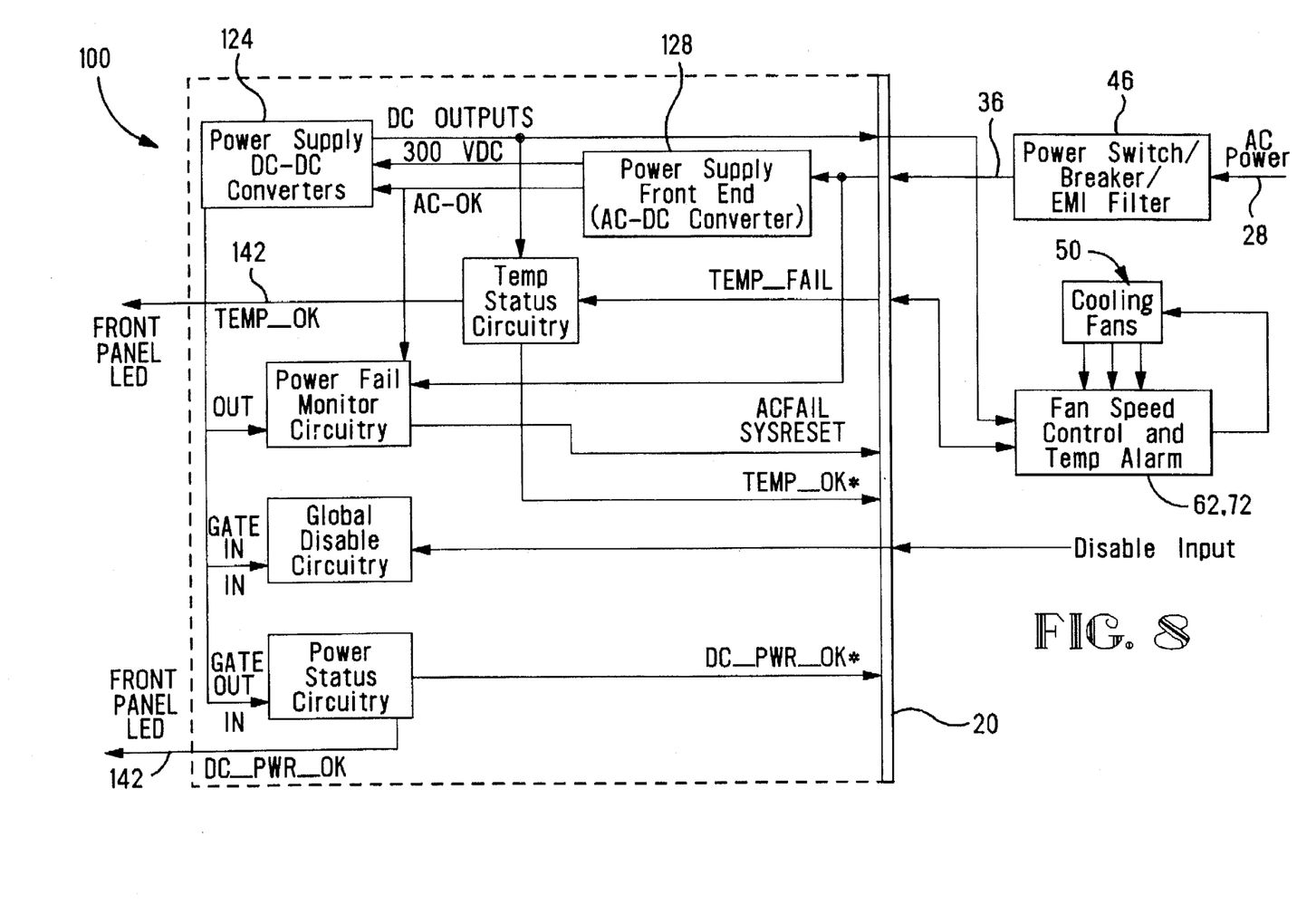
FIG. 8 is a diagrammatic representation of the several types of circuits of the power supply interrelated to the backplane and to the AC power input.

Referring to FIG. 8, power supply module 100 is provided with electronic and electrical components for several power related circuit functions necessary for a completely self-contained power supply module. Such circuits or the components themselves provide: overvoltage protection; overcurrent protection; overtemperature protection; a Temperature Alarm to notify the operator of elevated temperatures; a Power Fail Monitor Circuit monitoring power input to the converters and DC power output therefrom; a Global Disable Circuit responsive to disable instruction input from the operator allowing shut-down by the operator from a remote location; a Power Status Circuit; and a Temperature Status Circuit responsive to the temperature alarm sensor associated with the cooling module control circuitry. Such circuits enable the power supply module to provide orderly power-up and power-down sequences to the providing of DC power to the backplane and the cooling fan module, and to "instruct" various microprocessors of the daughter cards to initiate storage of critical data in the event of power shut off, as well as providing a warning to the operator if an overtemperature condition exists.

Power supply module 100 can have, as shown in FIGS. 3 and 8, an array of DC-to-DC converters 124, shown having heat sinks 126 mounted thereon for effective dissipation of heat therefrom with fins aligned with the flow of forced air from cooling module 50 through metering slots 94 of baffle plate 90. Examples of such converters are sold by VICOR Corporation of Andover, Mass. as MiniMod DC-DC converters for 300 volts input having Part Nos. VI-J63CW and VI-J61CW providing 24 volts and 12 volts output voltage, respectively, at 100 watts output power, and also VI-200 Family DC-DC converters for 300 volts input providing 5 volts output having Part No. VI-260CU producing 200 watts per module, and Part No. VI-260CV coupled with Part No. VI-B60CV for producing 300 watts per pair. Converters in the VI-200 Family provide inherent overvoltage and overtemperature protection. Used with the converters are heat-sink Part Nos. 2113 and 04306 with GRAFOIL pads (Part Nos. 1777 and 04308) beneath the heatsinks for optimized thermal conductivity at the heatsink-converter interface, also sold by VICOR Corporation. Typical power and voltage outputs are +5v for 250 watts, +12v for 96 watts; −12v for 72 watts; +24v for 72 watts; −24v for 72 watts; −5.2v for 156 watts; and −2v for 14 watts. Optionally, a back up battery and associated charging circuitry may be provided for by the power supply module of the present invention, for producing +5v for STANDBY circuitry for storage of critical data by the microprocessors in the event of card cage power input shut-off, with the battery mountable either in the module or elsewhere within the card cage.

As shown in the embodiment of FIGS. 3 and 8, AC power input first is rectified such as by a Full Wave Bridge Rectifier defined by rectifier diodes 128 prior to being transmitted to storage capacitors 130 for eventual transmission to converters 124. Another example is a solid state rectifier sold by General Instrument under Part No. KBL005. Alternatively, in place of discrete rectifiers and storage capacitors 130, a component may be utilized such as an Harmonic Attenuator Module sold by VICOR Corporation having Part No. VI-HAM-CM, for 85 to 264 volts AC input providing 300 volts DC output to the DC-DC converters. Such a component could be placed in power port 46 of the card cage (FIGS. 1 and 2) rather than in power supply module 100 to alleviate space constraints in the desirably compact module.

Other components of power supply module 100 include an array of resistors, capacitors and diodes for the various circuits, and also are shown to include one or more chokes 132 for providing high levels of attenuation of common-mode currents and addressing emissions standards for electromagnetic and radiofrequency interference; a thermistor 134 for module temperature sensing; and a fuse holder assembly 136 for overcurrent protection. Preferably power supply module 100 also provides −2v output, such as by converters of the VI-J00 Family sold by VICOR; alternatively where space constraints are of concern, a field effect transistor 138 may used with inductance coils 140 for comprising a power supply to effect a change from −5.2 volts to −2 volts. Power supply module 100 also includes a pair of light emitting diodes 142 at apertures 144 through front panel 112 as signals indicating satisfactory in-service operating conditions for DC power and card cage temperature. Preferably, a cover plate (not shown) is secured over the array of components 104 on circuit board 102, such as by being fastened to stanchions 146.

Variations and modifications may be made to the specific embodiment disclosed herein, that are within the spirit of the invention and the scope of the claims.

What is claimed is:

1. A power supply module for a card cage, the card cage being of the type having a framework defining a card-receiving region and a backplane traversing an inner end of a card-receiving region, where the card cage framework provides pairs of guide channels for insertion of circuit cards for electrically interconnecting of their circuits with corresponding circuits of the backplane upon full insertion into the card-receiving region, the power supply module comprising:

a circuit card having electrical and electronic components thereon for receiving and conditioning input electrical power and distributing DC electrical power, the circuit card including a leading edge associated with the backplane and opposed side edges orthogonal thereto associated with the guide channels of the card cage framework; and electrical connectors mounted on said leading card edge appropriately electrically connected to said electrical and electronic components and positioned and sized and shaped for mating, upon full insertion of said circuit card into the card-receiving region at a power module site, with complementary electrical connectors mounted on the backplane at a power interconnection site thereof to establish electrical connections to receive AC power therefrom and transmit DC power thereto;

said components mounted on said circuit card defining a compact profile enabling insertion into the card-receiving region adjacent daughter circuit cards therein, said circuit board and said card-mounted components and connectors defining a module adapted to be inserted into a power module site of the card-receiving region from forwardly of the card cage and automatically establishing electrical connection with the AC power input for the card cage and DC power transmission to the backplane, and said module being sufficient for supplying the DC power requirements of the card cage in a single package insertable into and removable from said card-receiving region as a single unit.

2. The power supply module of claim 1 wherein a front panel is mounted at a trailing edge of said circuit card dimensioned to close off said power module site upon full insertion of the module into the card-receiving region.

3. The power supply module of claim 2 wherein said front panel includes at least one ejector positioned and adapted to cooperate with adjacent portions of the card cage framework to eject the module when actuated.

4. The power supply module of claim 1 wherein said power module provides openings exposing said components to air being circulated by a card cage cooling system in said card-receiving region for heat dissipation.

5. The power supply module of claim 1 wherein said circuit card and components define a temperature monitoring system.

6. The power supply module of claim 1 wherein said circuit card and components define a voltage monitoring system.

7. The power supply module of claim 1 wherein said circuit card and components provide for conversion of AC electrical power input to DC power.

8. The power supply module of claim 1 wherein said circuit card and components provide DC power output for powering the cooling system of the card cage.

9. The power supply module of claim 1 wherein said circuit card and components provide signal input to the daughter cards to initiate storage of critical data in the event of power shut-off.

10. The power supply module of claim 1 wherein said circuit card and components provide for remote shut-off of DC power to the backplane upon operator instruction.

11. A card cage system comprising:

a framework defining a card-receiving region for holding an array of daughter circuit cards at respective daughter card sites upon insertion thereinto from a front face of said framework, a backplane traversing an inner end of said card-receiving region and having electrical connectors associated with respective ones of said daughter cards and mounted on said backplane adjoining said card-receiving region to establish electrical connections with daughter circuit cards upon their full insertion into said card-receiving region, and said framework providing pairs of guide channels for guided insertion of said daughter cards for electrical interconnection of their circuits with corresponding circuits of the backplane upon full insertion;

electrical connectors associated with electrical power and mounted on said backplane at a power interconnection site adjoining said card-receiving region at a power module site thereof and adapted to feed through alternating current electrical power input provided by conductor cables concluding in said backplane power connectors; and a power supply module, said power supply module including:
  a circuit card having electrical and electronic components thereon for receiving and conditioning electrical power input to DC electrical power, said circuit card including a leading edge associated with said backplane and opposed side edges orthogonal thereto associated with a respective pair of said guide channels of said card cage framework; and
  electrical connectors mounted on said leading card edge appropriately electrically connected to said electrical and electronic components and positioned and sized and shaped for mating, upon full insertion of said circuit card into said card-receiving region at said power module site, with said backplane power connectors to establish electrical connections to receive power input therefrom and transmit DC power thereto;
  said components mounted on said circuit card defining a compact profile enabling insertion into said card-receiving region adjacent daughter circuit cards therein, and
  said circuit card and said card-mounted components and connectors defining a module adapted to be inserted into the power module site of the card-receiving region from the front face of the card cage, and removable therefrom, and automatically establishing electrical connection for receipt of power input and transmission of DC power to the backplane upon full insertion into the card cage, and said module being sufficient for supplying the DC power requirements of the card cage in a single package insertable into and removable from said card-receiving region as a single unit.

12. The card cage system of claim 11 for use with AC power input and further providing for rectification of the AC power to DC power.

13. The card cage system of claim 12 wherein said rectification is provided by said power supply module.

14. The card cage system of claim 11 further including a system for cooling said circuit cards in said card-receiving region, and said power module provides openings exposing said components thereof to air being circulated by said card cage cooling system in said card-receiving region for heat dissipation.

15. The card cage system of claim 14 wherein said cooling system comprises a cooling module and an air flow meter, said cooling module being insertable into and removable from a cooling module site of said card cage from forwardly thereof.

16. The card cage system of claim 15 wherein said air flow meter is a baffle plate mounted between said cooling module and said card-receiving region, said baffle plate including an array of apertures of limited size associated with each daughter card site and aligned to permit air flow between ones of said guide channels secured to an adjacent interior sidewall bounding said card-receiving region, and further including a row of large-dimensioned slots associated with said power module site dimensioned to provide a substantial flow of air across said components of said power supply module for dissipation of thermal energy therefrom, the dimensions of said apertures and said slots selected to provide optimum air flow from said cooling module to said power supply module while maintaining sufficient air flow to said daughter cards within said card-receiving region during in-service use.

17. The card cage system of claim 15 wherein said cooling module comprises at least one fan unit and a control circuit therefor, and an electrical connector mounted on an inner end panel to establish electrical interconnections of said control circuit with circuits of said backplane upon full insertion of said cooling module into a cooling module site of said card cage.

18. The card cage system of claim 17 wherein said control circuit provides variable fan speed control in response to air temperature exiting said card-receiving region.

19. The card cage system of claim 15 wherein said cooling module includes an electrical connector mounted on a leading end thereof matable with a complementary connector mounted within the card cage upon full insertion of said cooling module into said card cage at a cooling module site to establish necessary electrical power and signal interconnections for operation of the cooling module.

20. A card cage system comprising:
  a framework defining a card-receiving region forwardly of a backplane for holding an array of daughter circuit cards and a power supply module at respective sites upon insertion thereinto from a front face of said framework; and
  a system for cooling said circuit cards in said card-receiving region and components of said power supply module, and comprising a cooling module and an air flow meter,
  said air flow meter being a baffle plate mounted between said cooling module and said card-receiving region, said baffle plate including an array of apertures of limited size associated with each daughter card site and aligned to permit air flow between ones of said guide channels secured to an adjacent interior sidewall bounding said card-receiving region, and further including a row of large-dimensioned slots aligned with said power module and dimensioned to provide a substantial flow of air across said components of said power supply module for dissipation of thermal energy therefrom, the dimensions of said apertures and said slots selected to provide optimum air flow from said cooling module to said power supply module while maintaining sufficient air flow to said daughter cards within said card-receiving region during in-service use.

21. A card cage system comprising:
  a framework defining a card-receiving region forwardly of a backplane for holding an array of daughter circuit cards and a power supply module at respective sites upon insertion thereinto from a front face of said framework; and
  a system for cooling said circuit cards in said card-receiving region and components of said power supply module, and comprising a cooling module and a baffle plate,
  said power supply module and said cooling module each being insertable into and removable from said card cage from forwardly thereof, and upon full insertion into said card cage, each establishing electrical connections with said backplane, and
  said baffle plate mounted between said cooling module and said card-receiving region including an array of apertures of limited size associated with each said daughter card site, and a row of large-dimensioned slots associated with said power module site, with dimensions of said apertures and said slots selected to provide optimum air flow from said cooling module to said power module while maintaining sufficient air flow to said daughter cards.

* * * * *